(12) United States Patent
Fischer et al.

(10) Patent No.: US 9,887,069 B2
(45) Date of Patent: Feb. 6, 2018

(54) CONTROLLING ION ENERGY DISTRIBUTION IN PLASMA PROCESSING SYSTEMS

(75) Inventors: Andreas Fischer, Castro Valley, CA (US); Eric Hudson, Berkeley, CA (US)

(73) Assignee: Lam Research Corporation, Fremont, CA (US)

( * ) Notice: Subject to any disclaimer, the term of this patent is extended or adjusted under 35 U.S.C. 154(b) by 1328 days.

(21) Appl. No.: 12/634,959

(22) Filed: Dec. 10, 2009

(65) Prior Publication Data

US 2010/0154994 A1 Jun. 24, 2010

Related U.S. Application Data

(60) Provisional application No. 61/139,488, filed on Dec. 19, 2008.

(51) Int. Cl.
*H01J 37/32* (2006.01)

(52) U.S. Cl.
CPC .. *H01J 37/32623* (2013.01); *H01J 37/32091* (2013.01)

(58) Field of Classification Search
CPC .............. H01J 37/32091; H01J 37/32146
USPC .............. 118/715, 722, 723 R, 723 E; 156/345.43–345.47; 315/111.21
See application file for complete search history.

(56) References Cited

U.S. PATENT DOCUMENTS

| | | | |
|---|---|---|---|
| 5,895,558 A * | 4/1999 | Spence | 204/164 |
| 6,110,287 A * | 8/2000 | Arai et al. | 156/345.34 |
| 6,201,208 B1 | 3/2001 | Wendt et al. | |
| 2001/0013504 A1 * | 8/2001 | Imafuku et al. | 216/71 |
| 2002/0037374 A1 | 3/2002 | Gherardi et al. | |
| 2002/0038631 A1 * | 4/2002 | Sumiya et al. | 118/723 E |
| 2003/0029567 A1 * | 2/2003 | Dhindsa et al. | 156/345.47 |
| 2003/0015056 A1 | 8/2003 | Quon | |
| 2004/0118344 A1 * | 6/2004 | Ni et al. | 118/723 E |

(Continued)

FOREIGN PATENT DOCUMENTS

| | | | | |
|---|---|---|---|---|
| JP | 2003-309111 | | 10/2003 | ......... H01L 21/3065 |
| JP | 2005-203491 | | 7/2005 | |
| JP | 2007-266533 | A | 10/2007 | |
| JP | 2008-263226 | | 10/2008 | |
| KR | 100491953 | B1 | 5/2005 | |
| KR | 10-0586402 | B1 | 6/2006 | |

OTHER PUBLICATIONS

"International Search Report", Issued in PCT Application No. PCT/US2009/068186; dated Jul. 2, 2010.

(Continued)

*Primary Examiner* — Yuechuan Yu
(74) *Attorney, Agent, or Firm* — Martine Penilla Group, LLP

(57) ABSTRACT

A plasma processing system for processing at least a substrate with plasma. The plasma processing chamber is capable of controlling ion energy distribution. The plasma processing system may include a first electrode. The plasma processing system also includes a second electrode that is different from the first electrode and is configured for bearing the substrate. The plasma processing system may also include a signal source coupled with the first electrode. The signal source may provide a non-sinusoidal signal through the first electrode to control ion energy distribution at the substrate when the substrate is processed in the plasma processing system, wherein the non-sinusoidal signal is periodic.

10 Claims, 9 Drawing Sheets

(56) References Cited

U.S. PATENT DOCUMENTS

| | | | |
|---|---|---|---|
| 2005/0241762 A1* | 11/2005 | Paterson | H01J 37/32082 156/345.28 |
| 2006/0037701 A1* | 2/2006 | Koshiishi et al. | 156/345.44 |
| 2006/0144518 A1 | 7/2006 | Kaji et al. | |
| 2008/0236750 A1* | 10/2008 | Koshimizu | B08B 7/0042 156/345.38 |
| 2008/0317965 A1* | 12/2008 | Son et al. | 427/446 |
| 2009/0127101 A1* | 5/2009 | Nauman et al. | 204/192.26 |

OTHER PUBLICATIONS

"Written Opinion", Issued in PCT Application No. PCT/US2009/068186; dated Jul. 2, 2010.

Heil, et al., "On the possibility of making a geometrically symmetric RF-CCP discharge electrically asymmetric", Brian G. Heil1, Uwe Czametzki1, Ralf Peter Brinkmann2 and Thomas Mussenbrock2, 1 Institut für Plasma- und Atomphysik, Rhur-Universit"at Bochum, Geb"aude NB 05/692, D-44780 Bochum, Germany 2 Lehrstuhl für Theoretische Elektrotechnik, Rhur-Universit"at Bochum, Universit"atsstraβe 150, D-44801, Bochum, Germany E-mail: bgheil2@yahoo.com, 2008, pp. 1-39.

Ruhr-Universitat Bochum, Germany, "New Technology Offer—Novel method of controlling ion energy and flux in capacitively coupled radio frequency discharges", rubitec GmbH, Dietmar Tappe, Stiepeler Str. 129, 44801 Bochem; rubitec@ruhr-uni-bochum.de, Jun. 4, 2008, p. 1.

"International Preliminary Report on Patentability", Issued in PCT Application No. PCT/US2009/068136; dated Jun. 30, 2011.

* cited by examiner

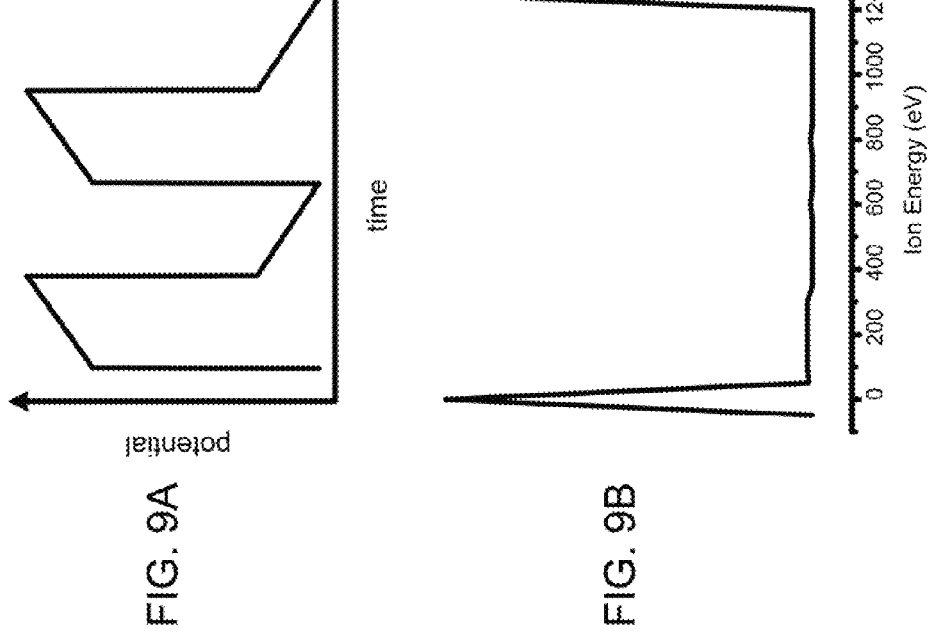

US 9,887,069 B2

CONTROLLING ION ENERGY DISTRIBUTION IN PLASMA PROCESSING SYSTEMS

CROSS REFERENCE TO RELATED APPLICATION

The present invention claims priority under 35 U.S.C. 119(e) to a commonly owned provisionally filed patent application entitled "CONTROLLING ION ENERGY DISTRIBUTION IN PLASMA PROCESSING SYSTEMS," U.S. Application No. 61/139,488, filed on Dec. 19, 2008, by inventors Andreas Fischer and Eric Hudson, all of which is incorporated herein by reference.

BACKGROUND OF THE INVENTION

The present invention relates to plasma processing of substrates (or wafers). In particular, the invention relates to controlling ion energy distribution when processing a substrate in a plasma processing system.

Controlling ion energy distribution may provide several benefits in processing the substrate. For example, controlling ion energy distribution may enable the control of etch selectivity between different materials, the reduction of faceting at feature edges (e.g., edges of trenches or vias), and the control of profiles in high aspect-ratio contacts. In modern plasma processing applications, controlling the distribution of ion energy may be critical for achieving desirable processing results. A method for controlling ion energy distribution has been disclosed in U.S. Pat. No. 6,201,208 "Method And Apparatus For Plasma Processing With Control Of Ion Energy Distribution At The Substrates" (issued Mar. 13, 2001), for example.

Prior art techniques for controlling ion energy distribution tend to involve providing a non-sinusoidal radio frequency (RF) signal/power to a substrate-bearing electrode that supports the substrate. This non-sinusoidal signal may control the ion energy distribution, for example, by attracting ions. Prior art techniques for controlling ion energy distribution also tend to require the use of an external DC blocking capacitor between the non-sinusoidal RF signal source and the substrate-bearing electrode.

There are several disadvantages associated with the prior art approaches and given constant advances in the semiconductor processing field, improved techniques and apparatus for controlling ion energy distribution in a plasma processing chamber are desired.

SUMMARY OF INVENTION

An embodiment of the present invention relates to a plasma processing system for processing at least a substrate with plasma. The plasma processing chamber is capable of controlling ion energy distribution. The plasma processing system may include a first electrode. The plasma processing system also includes a second electrode that is different from the first electrode and is configured for bearing the substrate. The plasma processing system may also include a signal source coupled with the first electrode. The signal source may provide a non-sinusoidal signal through the first electrode to control ion energy distribution at the substrate when the substrate is processed in the plasma processing system, wherein the non-sinusoidal signal is periodic.

The above summary relates to only one of the many embodiments of the invention disclosed herein and is not intended to limit the scope of the invention, which is set forth is the claims herein. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which:

FIG. 9A shows a schematic representation of a non-sinusoidal signal provided by a driver for controlling ion energy distribution in accordance with one or more embodiments of the present invention.

FIG. 9B shows a schematic representation of a calculated ion energy distribution based on an arrangement in accordance with one or more embodiments of the present invention

DETAILED DESCRIPTION

Figure 1:
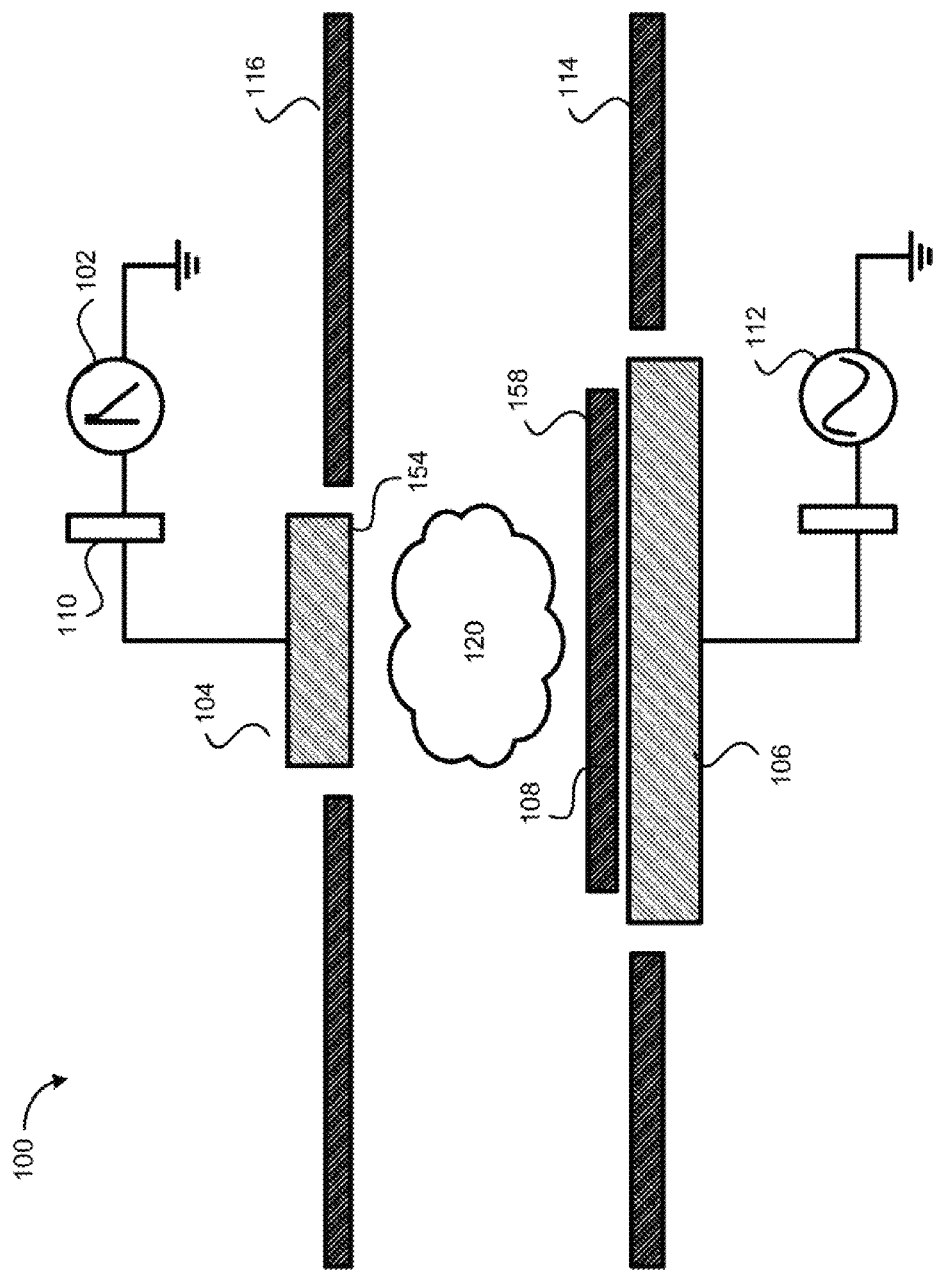
FIG. 1 shows a schematic representation of components of a plasma processing system capable of controlling ion energy distribution during plasma processing in accordance with one or more embodiments of the present invention.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

One or more embodiments of the invention relate to a plasma processing system capable of controlling ion energy distribution during processing of at least a substrate with plasma. The plasma processing system, which may be diode configuration or a triode configuration, includes at least one non-substrate bearing (NSB) electrode that is not in physical contact with the substrate and/or is not for bearing the substrate.

In an embodiment, the plasma processing system may include an ion energy distribution controlling signal source coupled with the NSB electrode. The ion energy distribution controlling signal source may provide a non-sinusoidal radio frequency (RF) signal/power to the NSB electrode for controlling the ion energy distribution at the substrate when the substrate is processed in the plasma processing system.

As an example, the NSB electrode may represent a top electrode disposed opposite to a substrate-bearing, bottom electrode that supports the substrate. Alternatively or additionally, the NSB electrode may represent a cylindrical electrode (e.g., a ring-shaped electrode) that surrounds the plasma, for example.

To sustain and generate processing plasma, a high-frequency sinusoidal signal/power for generating and sustaining the plasma may be provided to the top electrode, the ring electrode, and/or the bottom electrode according to various embodiments of the invention.

With the non-sinusoidal signal/power delivered to the NSB electrode, the plasma processing system may have a simplified electrical path for delivering the ion energy distribution controlling signal/power and therefore may have at least several advantages over the prior art techniques.

For example, compared with the substrate-bearing electrode, the NSB electrode typically has minimum or no insulation and clamping requirements; therefore, embodiments of the invention may have fewer design restrictions on the non-sinusoidal powered electrode.

Further, since the size of the NSB electrode does not need to match the size of the substrate, the size of the NSB electrode may be reduced. The inventors observe that there appears to be, in some cases, a possible tradeoff between the area ratio of the NSB electrode to the total electrode area in the chamber and the process window at any given RF sinusoidal signal duty cycle (which relates to the percentage of ions reaching the substrate at high energy). A higher duty cycle appears to require, in some cases, a larger area ratio (of NSB electrode area to total electrode area) to ensure a high voltage sheath develops at the substrate. Conversely, a lower duty cycle may result in the ability to employ a lower area ratio while maintaining a high voltage sheath at the substrate. If the area ratio is too small for a high duty cycle plasma generating RF signal, the non-sinusoidal voltage does not drop across the substrate sheath, and such high energy ions are not produced.

Nevertheless, embodiments of the invention may be able to minimize or eliminate the parasitic capacitance problems associated with the prior art techniques. The NSB has fewer design restrictions than the substrate-bearing electrode and can therefore be designed with smaller stray capacitance to ground. This in turn draws less RF current and has a faster response to step voltage changes. Advantageously, accuracy in controlling the ion energy distribution may be improved, and the costs of the RF components associated with controlling the ion energy distribution may be minimized.

In one or more embodiments, when the non-sinusoidal signal for controlling the ion energy distribution is provided to the NSB electrode, it is possible to provide such non-sinusoidal signal to the NSB electrode without requiring the use of an external, separate DC blocking capacitor between the non-sinusoidal source and the NSB electrode. In this case where the DC-blocking capacitor is not interposed between the non-sinusoidal signal source and the NSB electrode, other electrode surfaces are preferably isolated from DC ground, such as by using a layer of quartz material (or similarly suitable material) at the ground electrode.

In another embodiment, when the non-sinusoidal signal for controlling the ion energy distribution is provided to the NSB electrode, it is possible to provide such non-sinusoidal signal to the NSB electrode via an external, separate DC blocking capacitor between the non-sinusoidal source and the NSB electrode. In this case where the DC-blocking capacitor is employed between the non-sinusoidal signal source and the NSB electrode, other electrode surfaces are not required to be isolated from DC ground, such as by using a layer of quartz material (or similarly suitable material) at the ground electrode.

In an alternative embodiment, the non-sinusoidal signal for controlling the ion energy distribution may be provided to the substrate-bearing electrode. In this case, the sinusoidal signal employed for plasma generation may be provided to the same substrate-bearing electrode or may be provided to an electrode other than the substrate-bearing electrode. In this embodiment, it is also possible to eliminate the requirement that an external, separate DC-blocking capacitor be employed between the non-sinusoidal signal source (which is employed for ion energy distribution control) and the substrate bearing electrode as long as other electrode surfaces are isolated from DC ground, such as through the use of a dielectric covering (e.g., a quartz layer or similarly suitable material) or the substrate-bearing electrode has inherent series capacitance, e.g. an internal dielectric layer such as the case with the ceramic layer inside some substrate-bearing chuck.

In one or more embodiments, the invention may relate to methods implemented in a plasma processing system for controlling ion energy distribution at a substrate.

The features and advantages of the present invention may be better understood with reference to the figures and discussions that follow.

FIG. 1 shows a schematic representation of components of a plasma processing system 100 capable of controlling ion energy distribution during processing of a substrate 108 with plasma 120 in accordance with one or more embodiments of the present invention. Plasma processing system 100 may include a substrate-bearing electrode 106, a non-substrate bearing (NSB) electrode 104, a plasma generating signal source 112, and an ion energy distribution controlling signal source 102.

Substrate-bearing electrode 106 (e.g., a lower electrode) may support a substrate 108. Substrate-bearing electrode 106 may clamp (or attract) substrate 108 utilizing an electrostatic force and may be in physical contact with substrate 108.

NSB electrode 104 (e.g., a top electrode) may be disposed opposite to substrate-bearing electrode 106 and may include a surface 154 that faces a surface 158 of substrate 108. NSB electrode in general, however, may represent any electrode that is non-substrate bearing.

In one or more embodiments, the area of surface 154 may be substantially smaller than the area of surface 158 and may be substantially smaller than ground planes 116 and 114. Subject to the aforementioned area ratio/duty cycle tradeoff, the small size of NSB electrode 104 may enable reducing parasitic and series capacitance problems in some cases and may enable improving the efficiency in controlling the ion energy distribution in some cases.

Plasma generating signal source 112 may be coupled with substrate-bearing electrode 106, in an embodiment. Plasma generating signal source 112 may provide a plasma generating signal (e.g., a high-frequency sinusoidal signal) for establishing plasma 120 and sustaining the density plasma 120. The plasma generating signal may be fed to substrate-bearing electrode 106 and substrate 108. In one or more embodiments, plasma generating signal source 112 may be coupled with NSB electrode 104 and may provide the plasma generating signal to NSB electrode 104.

Ion energy distribution controlling signal source 102 may provide an ion energy distribution controlling signal (e.g., a non-sinusoidal RF signal) for controlling ion energy distribution at substrate 108. Ion energy distribution controlling signal source 102 may be coupled with NSB electrode 104 through a DC-blocking capacitor 110. In an advantageous embodiment, DC blocking capacitor 110 may be eliminated if other electrode surfaces are shielded from DC ground, such as when ground electrodes are coated with a quartz layer (or similarly suitable material) as is done in many modern plasma chamber designs. If an external DC-blocking capacitor is used between ion energy distribution controlling signal source 102 and NSB electrode 104, other electrode surfaces do not need to be shielded from DC ground.

In other embodiments, ion energy distribution controlling signal source 102 may be coupled to substrate bearing electrode 106 and may provide the non-sinusoidal signal for the purpose of controlling ion energy distribution without requiring the use of an external, separate DC-blocking capacitor in between. In this configuration, it is preferable either that other electrode surfaces are shielded from DC ground such as when they are coated with a quartz layer (or similarly suitable material) as is done in many modern plasma chamber designs or that the substrate electrode has inherent internal series capacitance, e.g. an internal dielectric layer such as the case with the ceramic layer inside some substrate-bearing chuck.

Features and advantages of the ion energy distribution controlling signal are discussed below with reference to the examples of FIGS. 6A-7B.

Figure 2:
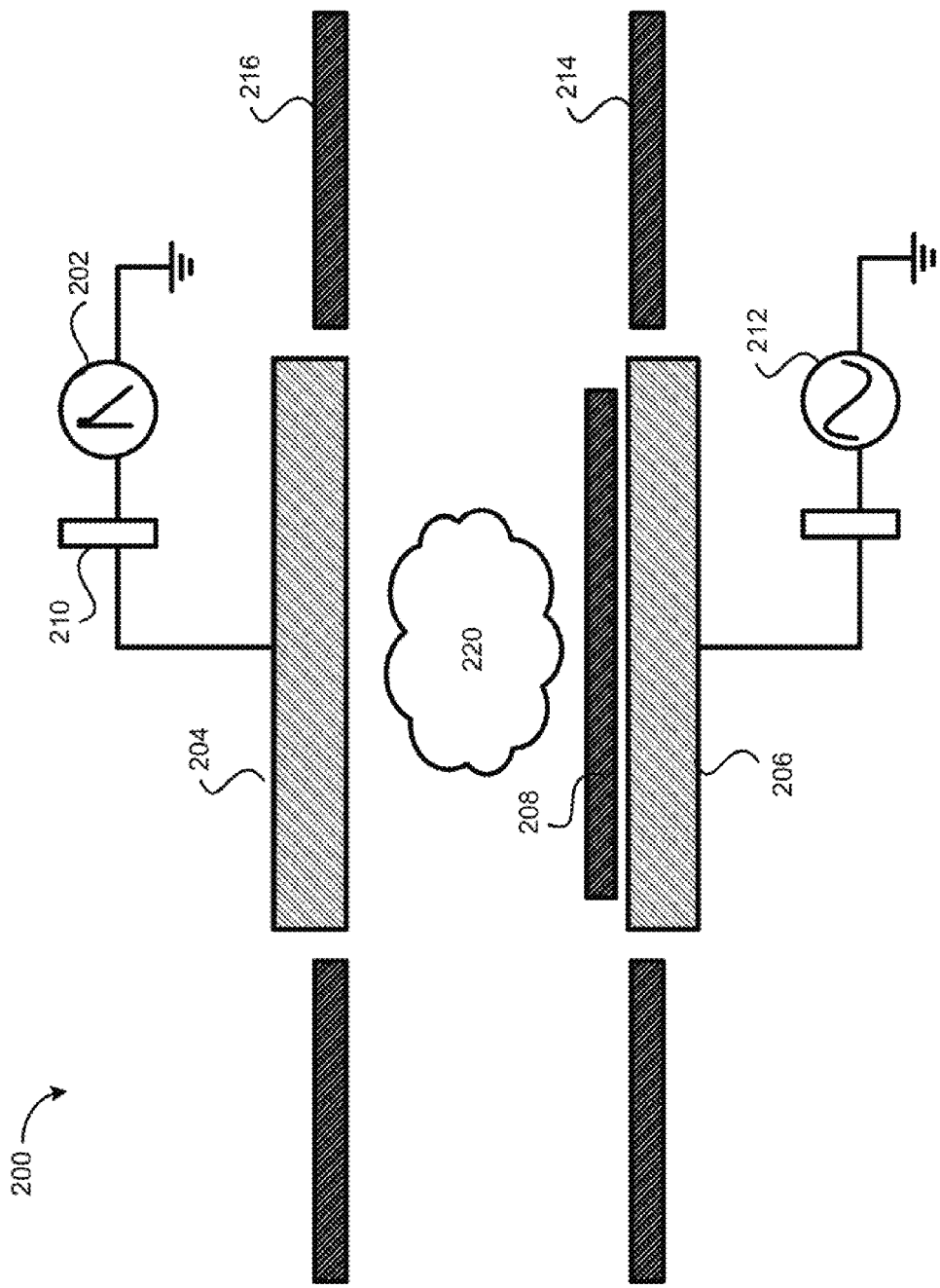
FIG. 2 shows a schematic representation of components of a plasma processing system capable of controlling ion energy distribution during plasma processing in accordance with one or more embodiments of the present invention.

FIG. 2 shows a schematic representation of components of a plasma processing system 200 capable of controlling ion energy distribution during processing a substrate 208 with plasma 220 in accordance with one or more embodiments of the present invention. Plasma processing system 200 may include a substrate-bearing electrode 206, a NSB electrode 204, a plasma generating signal source 212, and an ion energy distribution controlling signal source 202 (which may provide a non-sinusoidal signal through a DC-blocking capacitor 210 and NSB electrode 204). The components and arrangements of plasma processing system 200 may be similar to the components and arrangements of plasma processing system 100 in the example of FIG. 1. In addition, plasma processing system 200 may include a symmetric configuration such that substrate-bearing electrode 206 and NSB electrode 204 may have substantially the same size and/or the same surface area; the associated ground planes 214 and 216 may have substantially the same size and/or the same surface area.

DC-blocking capacitor 210 may be eliminated in one or more embodiments under considerations similar to those discussed in connection with the elimination of the DC-blocking capacitor in the example of FIG. 1.

Figure 3:
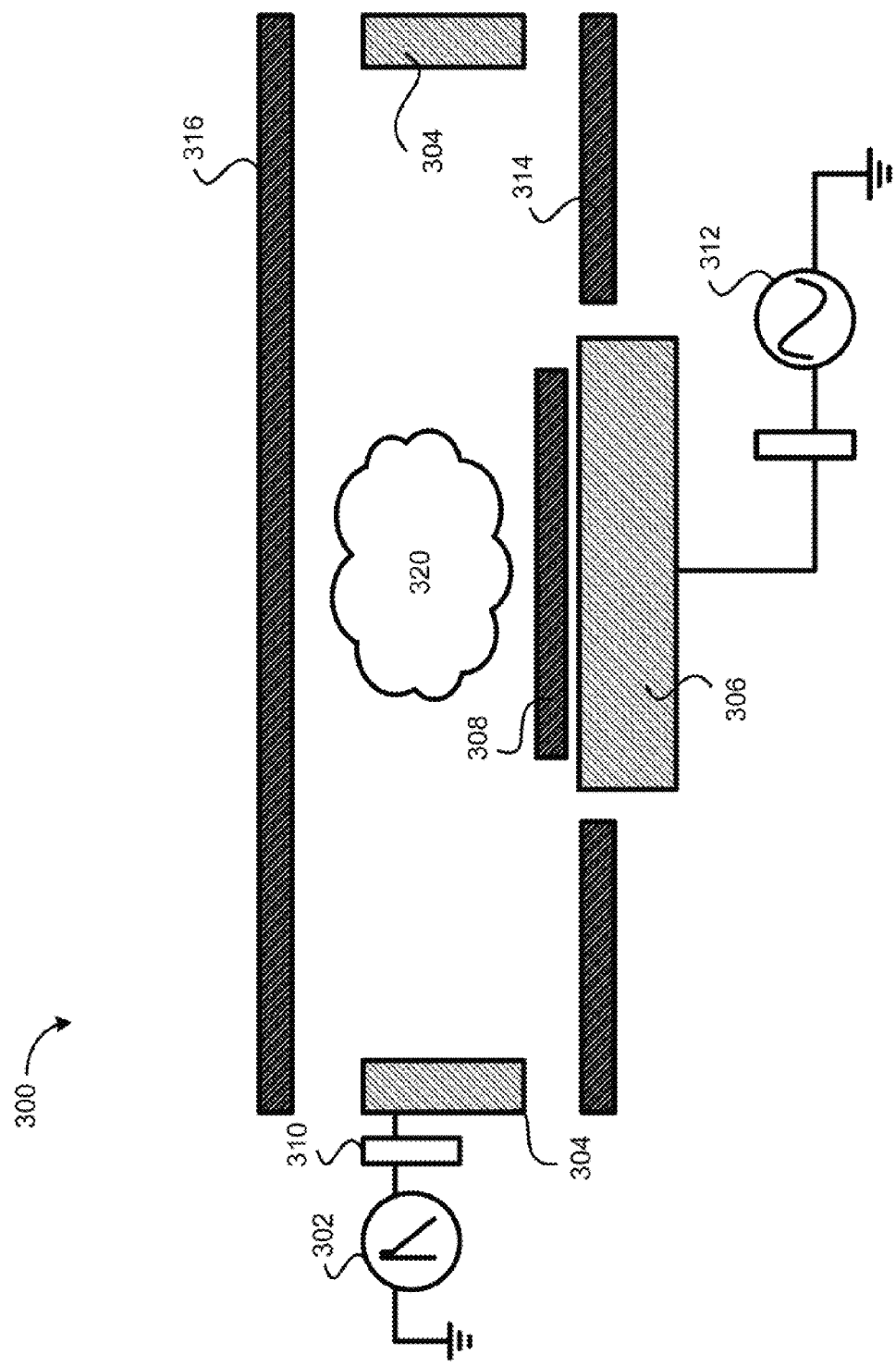
FIG. 3 shows a schematic representation of components of a plasma processing system capable of controlling ion energy distribution during plasma processing in accordance with one or more embodiments of the present invention.

FIG. 3 shows a schematic representation of components of a plasma processing system 300 capable of controlling ion energy distribution during processing a substrate 308 with plasma 320 in accordance with one or more embodiments of the present invention. Plasma processing system 300 may include a substrate-bearing electrode 306 for supporting substrate 308, a cylindrical (e.g., ring-shaped) NSB electrode 304 that may surround plasma 320, a NSB electrode 316, a plasma generating signal source 312, and an ion energy distribution controlling signal source 302.

Plasma generating signal source 312 may be coupled with substrate-bearing electrode 306. Plasma generating signal source 312 may provide a plasma generating signal to substrate-bearing electrode 306 and substrate 308 for establishing plasma 320. Alternatively or additionally, plasma generating signal source 312 may provide the plasma generating signal to cylindrical NSB electrode 304 and/or NSB electrode 316.

Ion energy distribution controlling signal source 302 may be coupled with cylindrical NSB electrode 304 through DC-blocking capacitor 310. Ion energy distribution controlling signal source 302 may provide a non-sinusoidal signal through DC-blocking capacitor 310 and cylindrical NSB electrode 304, wherein NSB electrode 316 may be grounded. Surrounding plasma 320, cylindrical NSB electrode 304 may promote the homogeneity and/or effectiveness in controlling the ion energy distribution.

Alternatively or additionally, ion energy distribution controlling signal source 302 may provide the non-sinusoidal signal to NSB electrode 316.

DC-blocking capacitor 310 may be eliminated in one or more embodiments under considerations similar to those discussed in connection with the elimination of the DC-blocking capacitor in the example of FIG. 1.

Figure 4:
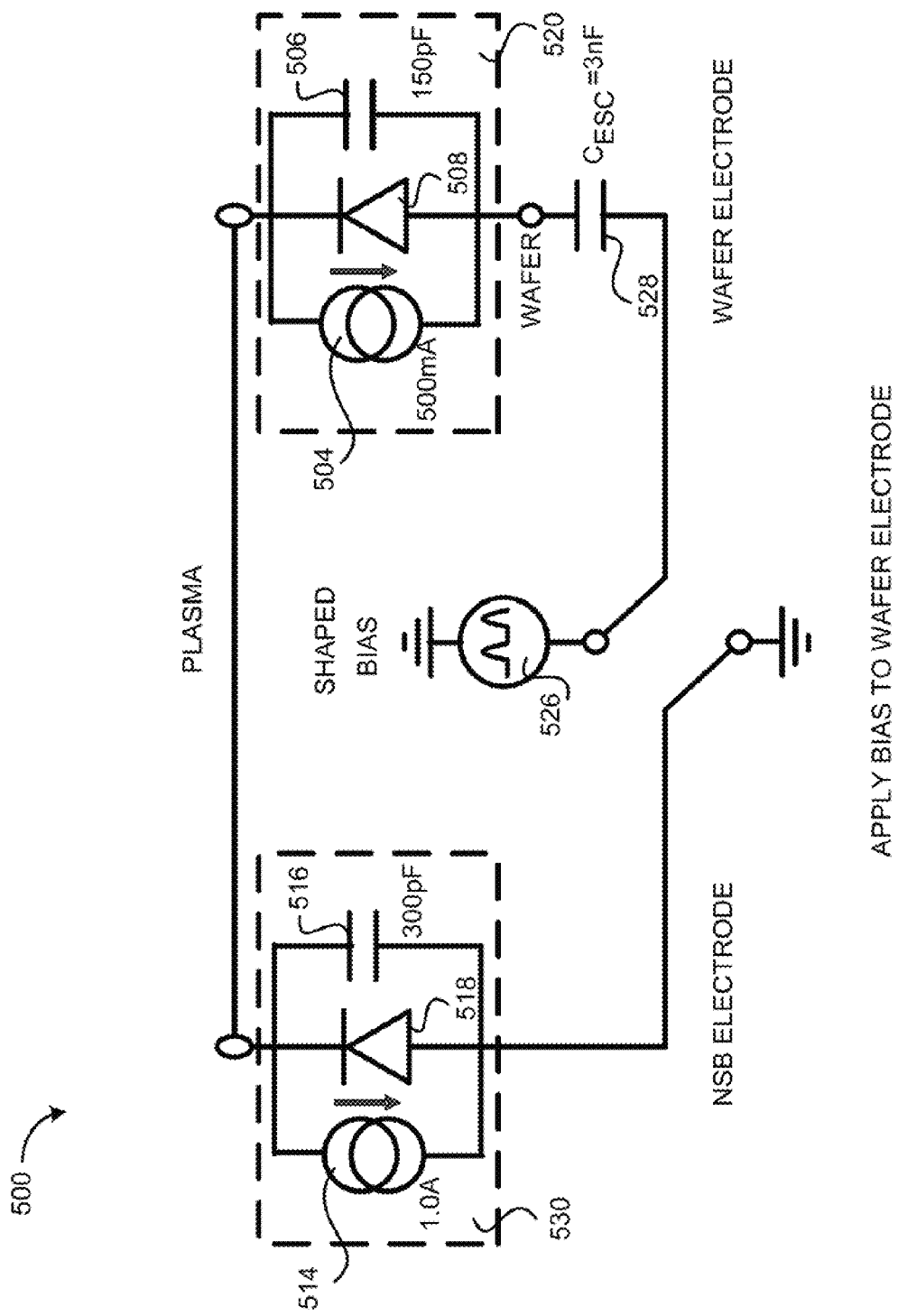
FIG. 4 shows a schematic representation of a circuit model representing a prior art plasma processing system capable of controlling ion energy distribution.

FIG. 4 shows a schematic representation of a circuit model 500 representing a prior art plasma processing system capable of controlling ion energy distribution. Circuit model 500 may include a NSB electrode portion 530 and a substrate-bearing electrode portion 520. Circuit portion 530 may include a diode 518, a capacitor 516, and a current source 514 representing the plasma sheath at the NSB electrode. Diode 518 may model the rectification property of the plasma sheath, which results from the periodic collapse of the sheath. Capacitor 516 may model the RF coupling through sheath between the plasma and the electrode surface. Current source 514 may model the DC ion current going through the plasma sheath. Substrate-bearing electrode portion 520 may include a diode 508, a capacitor 506, and a current source 504, similar to diode 518, capacitor 516, and current source 514 of NSB electrode portion 530, respectively.

In circuit model 500, an ion energy distribution controlling signal source 526 may feed an ion energy distribution controlling signal though a DC-blocking capacitor 528 and substrate-bearing electrode portion 520.

Figure 5:
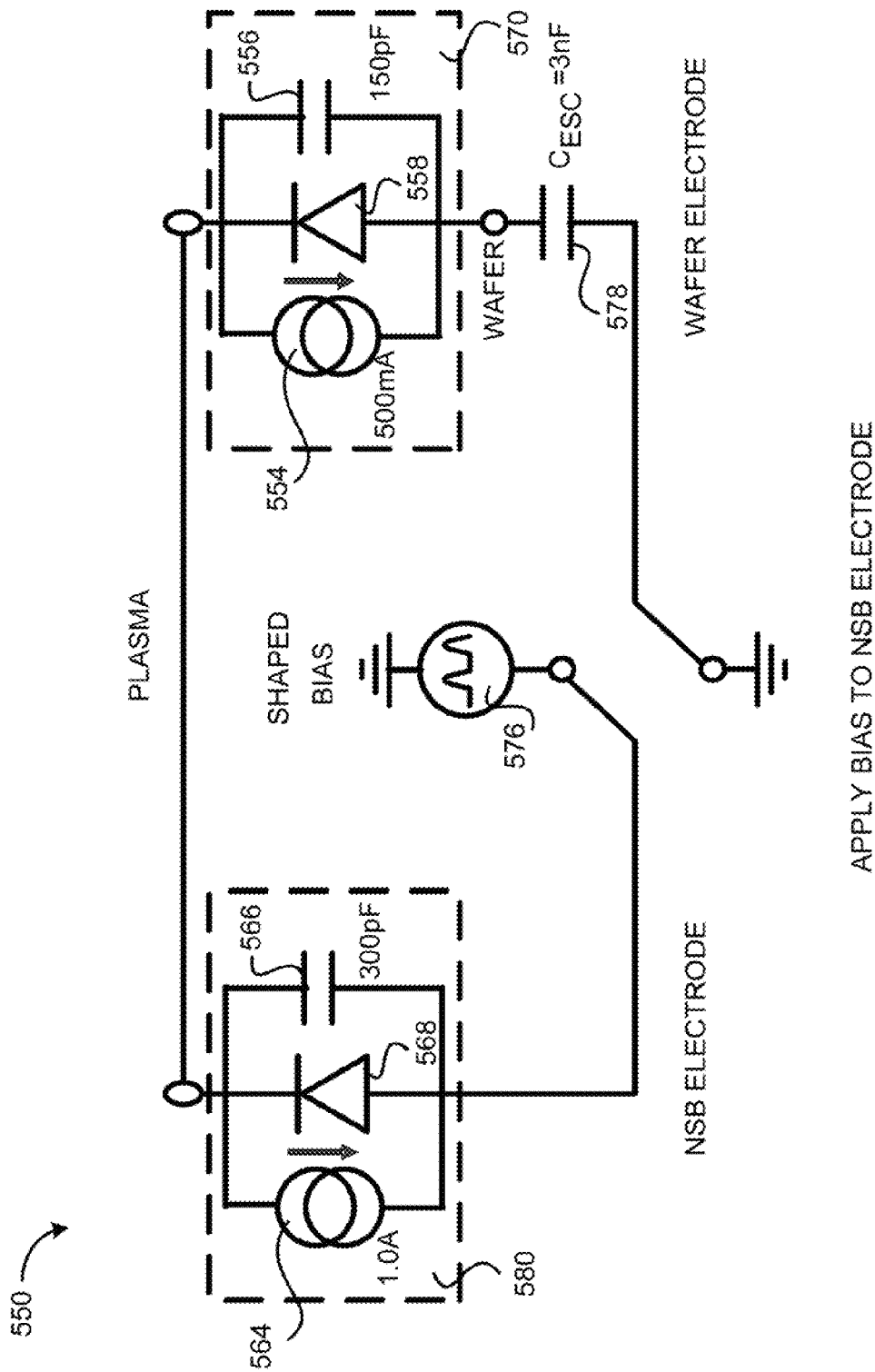
FIG. 5 shows a schematic representation of a circuit model representing a plasma processing system capable of controlling ion energy distribution in accordance with one or more embodiments of the present invention.

FIG. 5 shows, in accordance with an embodiment of the invention, a schematic representation of a circuit model 550 representing a plasma processing system capable of controlling ion energy distribution wherein the ion energy distribution controlling signal source 576 is coupled to the NSB electrode instead of to the substrate bearing electrode (as is done in the case of FIG. 4). Circuit model 550 may include a NSB electrode portion 580 and a substrate-bearing electrode portion 570. Circuit portion 580 may include a diode 568, a capacitor 566, and a current source 564 representing the plasma sheath at the NSB electrode. Diode 568 may model the rectification property of the plasma sheath, which results from the periodic collapse of the sheath. Capacitor 566 may model the RF coupling through sheath between the plasma and the electrode surface. Current source 564 may model the DC ion current going through the plasma sheath. Substrate-bearing electrode portion 570 may include a diode 558, a capacitor 556, and a current source 554, similar to diode 568, capacitor 566, and current source 564 of NSB electrode portion 580, respectively.

In circuit model 550, an ion energy distribution controlling signal source 576 may feed an ion energy distribution controlling signal to NSB electrode portion 580.

Figure 6A:
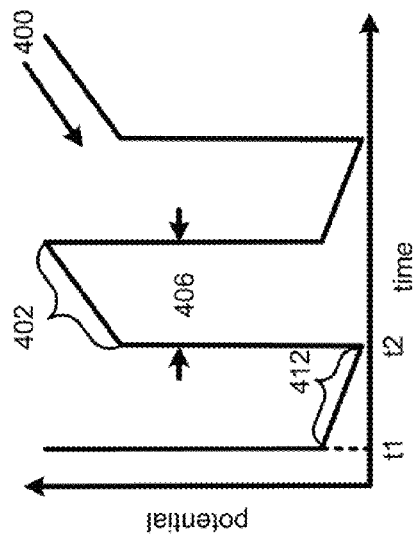
FIG. 6A shows a schematic representation of a non-sinusoidal signal applied at a substrate for controlling ion energy distribution in a prior art plasma processing system capable of controlling ion energy distribution.
Figure 6B:
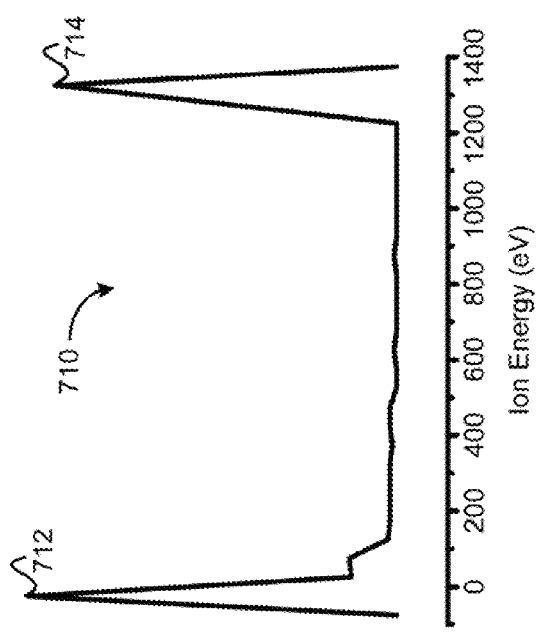
FIG. 6B shows a schematic representation of a calculated ion energy distribution based on a prior art arrangement.

FIG. 6A shows a schematic representation of a non-sinusoidal signal 400 (hereinafter "signal 400") applied to a substrate for controlling ion energy distribution at the substrate in accordance with prior art. Non-sinusoidal signal 400 may be a voltage signal provided over time, which is optimized to produce a narrow range of high energy ions at the substrate electrode. FIG. 6B shows the resulting IEDF at the substrate predicted by the model, with two dominating peaks at the low and high energy extremes.

For typical plasma processing (e.g., dielectric etch), most or all ions reaching the substrate surface are positively charged. Therefore, signal 400 may include one or more negative non-sinusoidal voltage portions, such as portion 412 between $t_1$ and $t_2$, for driving the substrate electrode to a negative potential relative to the plasma potential for drawing out the ions, to provide a controlled ion energy distribution at the substrate including high energy ions. Over a substantial length of time, the negative potential of the substrate electrode should stay substantially constant (instead of being sinusoidal) for attracting the ions at a desirable and substantially constant energy.

However, the substrate may typically be electrically floating with respect to DC ground, i.e. due to internal or external series capacitance, and may not discharge accumulated charge from incident ions. Therefore, from time to time, e.g., periodically, signal 400 may need to include positive pulses, such as pulse 402, to attract electrons from the plasma to neutralize the charge accumulated on the substrate electrode. As an example, the pulses may be periodically applied at a frequency of 400 KHz (with a period length of 2.5 ms).

Given the accumulating positive charge on the substrate electrode during the negative-voltage portions (e.g. portion 412), an increasingly positive potential develops at the substrate electrode during the positive-voltage portion of the applied waveform at the NSB electrode. This will result in gradually decreasing ion energy at the substrate, essentially degrading and broadening the high energy peak in the time-averaged IEDF at the substrate. This can be addressed by shaping the waveform as shown in FIG. 6A.

Figure 7A:
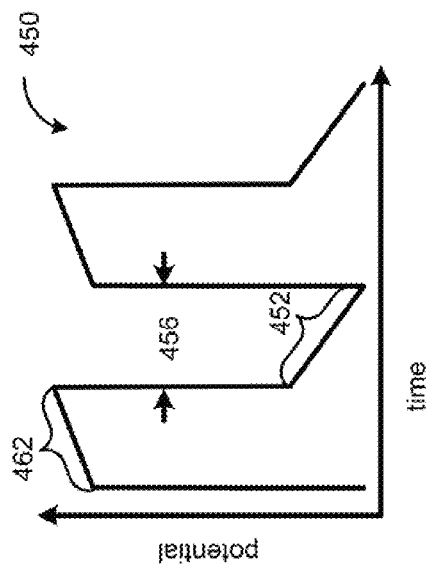
FIG. 7A shows a schematic representation of a non-sinusoidal signal provided by a driver for controlling ion energy distribution in accordance with one or more embodiments of the present invention.

FIG. 7A shows a schematic representation of a non-sinusoidal signal 450 (hereinafter "signal 450") applied by a driver to the NSB electrode, which results in the application of a signal similar to signal 400 to the substrate in accordance with one or more embodiments of the present invention. As an example, the driver may represent a shaped-waveform generator shown in the example of FIG. 1. Signal 450 may include ramped positive-voltage portions (e.g., ramped portion 462) corresponding to negative-voltage portions (e.g., portion 412) of signal 400. Signal 450 may also include pulses (e.g., pulse 452) corresponding to pulses (e.g., pulse 402) of signal 400. In the example shown, the signal 450 is just the inversion of the signal 400, with the change in polarity of applied voltage required due to the change in location of RF power application.

To address the gradual charge-up of the substrate electrode, in signal 450, the magnitude of each positive portion, e.g., portion 462, between the periodic pulses may be configured to increase over time to counteract the increase of positive ions at the substrate electrode for forming the substantially constant portion in signal 400. Accordingly, ions may be efficiently and effectively attracted to the substrate at a substantially constant energy.

The optimal width 406 of pulse 402 (corresponding to width 456 of pulse 452 in signal 450) may depend on the size of the NSB electrode with respect to the total electrode area, in order to ensure that the applied voltage waveform drops primarily across the substrate electrode and not at the NSB electrode, in either circuit 500 or 550

FIG. 6B shows a schematic representation of calculated ion energy distribution 710 based on a first prior art arrangement with a non-sinusoidal signal fed to a substrate-bearing electrode, such as the arrangement in circuit model 500 illustrated in the example of FIG. 4. Ion energy distribution 710 may include a low-ion-energy peak 712 and a high-ion-energy peak 714.

Figure 7B:
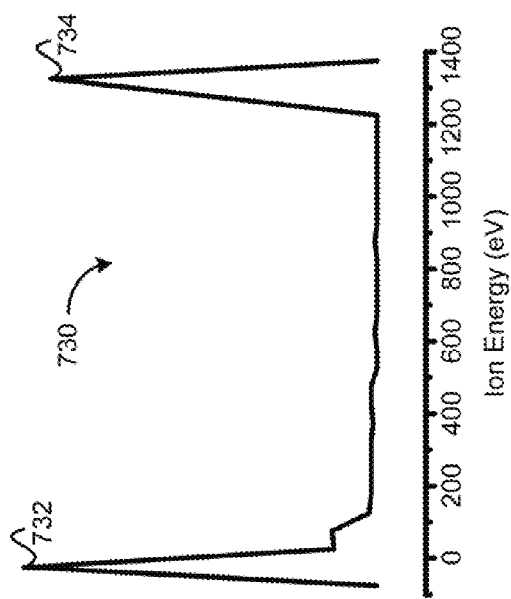
FIG. 7B shows a schematic representation of a calculated ion energy distribution based on an arrangement in accordance with one or more embodiments of the present invention.

FIG. 7B shows, in accordance with an embodiment, a schematic representation of ion energy distribution 730 based on an arrangement, such as the arrangement in circuit model 550 illustrated in the example of FIG. 5, with a non-sinusoidal signal fed to a NSB (non-substrate-bearing) electrode in accordance with one or more embodiments of the present invention. Ion energy distribution 730, with a low-ion-energy peak 732 and a high-ion-energy peak 734, may be substantially equivalent to ion energy distribution 710 and also may be suitable for the particular application.

Ion energy distribution 730 may be obtained from utilizing circuit model 550 illustrated in the example of FIG. 5 with the RF waveform utilized for generating ion energy distribution 710 inverted and applied to NSB electrode portion 580. Ion energy distribution 730 may be suitable for any control applications that ion energy distribution 710 is generated for.

As discussed with reference to one or more of FIGS. 1-7B, the arrangement of feeding the ion energy distribution controlling signal though NSB electrode portion 580 may provide substantial advantages, such as improved control efficiency, energy efficiency, and cost-effectiveness.

Figure 8:
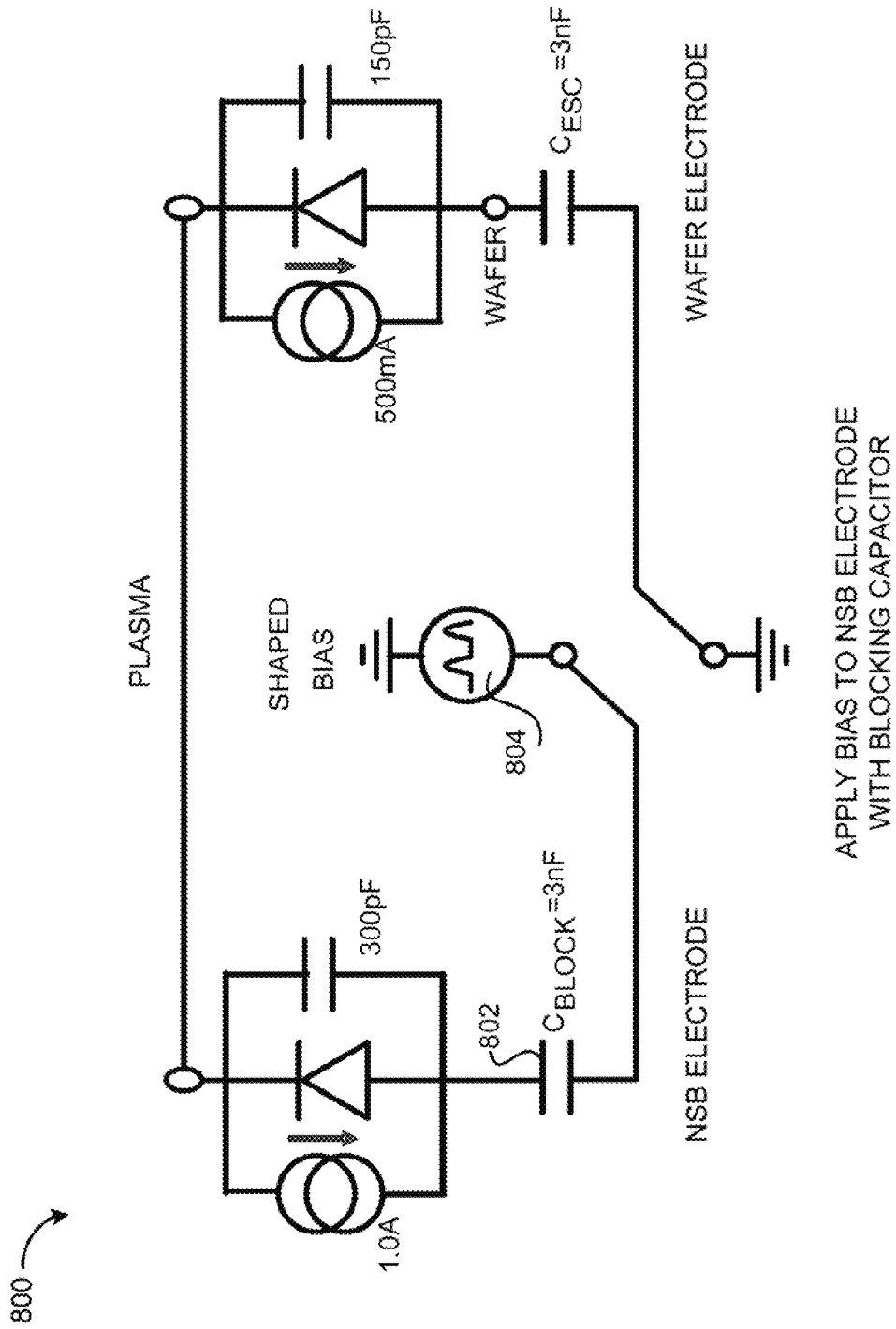
FIG. 8 shows schematic representation of a circuit model representing a plasma processing system capable of controlling ion energy distribution in accordance with one or more embodiments of the present invention.

FIG. 8 shows, in accordance with an embodiment of the invention, a schematic representation of a circuit model 800 representing a plasma processing system capable of controlling ion energy distribution wherein the ion energy distribution controlling signal source 804 is coupled to the NSB electrode via a blocking capacitor 802. With the exception of blocking capacitor 802, the rest of the circuit of FIG. 8 is similar to that of FIG. 5 and will not be elaborated here.

When the ion energy distribution controlling signal source 804 of FIG. 8 feeds an ion energy distribution controlling signal (see FIG. 9A) that is similar to the ion energy distribution controlling signal employed in FIG. 5 (see FIG. 7A) to the NSB electrode via DC blocking capacitor 802, the ion energy distribution shown in FIG. 9B is substantially similar to that obtained in FIG. 7B that is associated with the circuit of FIG. 5. Strictly speaking, the ion energy distribution controlling signal of FIG. 9A has been optimized for the circuit of FIG. 8. Irrespective, the result shows that the addition of an external DC blocking capacitor (such as blocking capacitor 802) between the ion energy distribution controlling signal source and the NSB electrode does not significantly alter the ion energy distribution (comparing FIG. 9B and FIG. 7B).

As can be appreciated from the foregoing, with the ion energy distribution controlling signal/power (e.g., non-sinusoidal power) delivered to a NSB electrode, embodiments of the invention may have substantial advantages over the prior art techniques.

For example, since the NSB electrode may have minimum or no insulation and clamping requirements, embodiments of the invention less design constraint on the non-sinusoidal powered electrode.

Embodiments of the invention may be able to minimize or eliminate the parasitic capacitance problems associated with the prior art techniques, because the NSB has fewer design restrictions than the substrate bearing electrode. Subject to the possible tradeoff between area ratio and duty cycle discussed earlier, since the size oldie NSB electrode does not need to match the size of the substrate, the size of the NSB electrode may be reduced. As a result, stray capacitance may be reduced further. Lower stray capacitance corresponds to faster response to pulse steps and a reduction in RF current required. Advantageously, precision in controlling the ion energy distribution may be improved, and the costs of the RF components associated with controlling the ion energy distribution may be minimized.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section may be provided herein for convenience and, due to word count limitation, may be accordingly written for reading convenience and should not be employed to limit the scope of the claims. It may be therefore intended that the following appended claims be interpreted as including all such alternations, permutations, and equivalents as fall within the true spirit and scope of the present invention.

What is claimed is:

1. A plasma processing system for processing a substrate with plasma, said plasma processing system comprising:
    a first electrode, wherein said first electrode is a non-substrate bearing electrode;
    a first ground plate configured to surround the first electrode, such that the first ground plate extends away from a center of the first electrode, and the first ground plate disposed at a physical separation from the first electrode;
    a second electrode, said second electrode being different from said first electrode, said second electrode being configured for bearing said substrate;
    a second ground plate configured to surround the second electrode, such that the second ground plate extends away from a center of the second electrode, the second ground plate disposed at a physical separation from the second electrode, the plasma during processing is defined between the first electrode and the second electrode and the center of the first electrode and the center of the second electrode are substantially aligned with one another, and wherein an interior diameter area of the first ground plate is disposed over the second electrode, wherein the first electrode has a diameter that is smaller than a diameter of the second electrode;
    a first signal source coupled with said first electrode and configured to provide a non-sinusoidal signal to said first electrode for controlling ion energy distribution at said substrate when said substrate is disposed on said second electrode in said plasma processing system, said first signal source produces the non-sinusoidal signal that is periodic, wherein each period of the non-sinusoidal signal includes positive ramped portions of a first voltage magnitude and negatively ramped portions of a second voltage magnitude, the negatively ramped portions immediately following the positive ramped portions, the first voltage magnitude is higher than the second voltage magnitude, and the positive ramped portions are separated from the negative ramped portions by a vertical voltage offset;
    a second signal source coupled to the second electrode, the second signal source configured to output a sinusoidal signal; and
    a blocking capacitor, said blocking capacitor being a direct current (DC) blocking capacitor and is positioned between said first electrode and said first signal source, wherein said DC blocking capacitor is separate from said first electrode, the DC blocking capacitor reduces parasitic and series capacitance, which increases efficiency in controlling the ion energy distribution at said substrate.

2. The plasma processing system of claim 1 further comprising:
    a dielectric layer disposed between said first ground plate and at least a portion of said first electrode for electrically isolating said first electrode from said first ground plate.

3. The plasma processing system of claim 1 wherein said second electrode is disposed opposite to said first electrode such that said substrate is disposed between said second electrode and said first electrode.

4. The plasma processing system of claim 1 wherein each said period defines a pulse.

5. The plasma processing system of claim 1 wherein each of said negatively ramped portions is configured to attract positive ions in said plasma processing system.

6. A plasma processing system comprising:
    a first electrode, wherein said first electrode is a non-substrate bearing electrode;
    a first ground plate configured to surround the first electrode, such that the first ground plate extends away from a center of the first electrode, and the first ground plate disposed at a physical separation from the first electrode;
    a second electrode, said second electrode being different from said first electrode, said second electrode being configured for bearing a substrate;
    a second ground plate configured to surround the second electrode, such that the second ground plate extends away from a center of the second electrode, the second ground plate disposed at a physical separation from the second electrode, and
    wherein the first electrode has a surface area that faces toward second electrode that is less than each of a surface area of the first ground plate that faces the second ground plate, and a surface area of the second ground plate that faces the first ground plate; and
    a first radio frequency (RF) signal source coupled with said first electrode and configured to provide a non-sinusoidal signal to said first electrode for controlling ion energy distribution at said substrate when said substrate is processed on said second electrode in said plasma processing system, said first RF signal source produces the non-sinusoidal signal that is periodic, wherein each period of the non-sinusoidal signal that is periodic includes pulses that have positive ramped portions of a first voltage magnitude and negatively ramped portions of a second voltage magnitude, the negatively ramped portions immediately following the positive ramped portions, the first voltage magnitude is higher than the second voltage magnitude, and a vertical voltage offset is defined between the positive ramped portions and negative ramped portions;

a second RF signal source coupled to the second electrode, the second RF signal source configured to output a sinusoidal signal;

a blocking capacitor, said blocking capacitor being a direct current (DC) blocking capacitor and is positioned between said first electrode and said first RF signal source, wherein said DC blocking capacitor is separate from said first electrode.

7. The plasma processing system of claim 6 further comprising:

a dielectric layer disposed between said first ground plate and at least a portion of said first electrode for electrically isolating said first electrode from said first ground plate.

8. The plasma processing system of claim 6 wherein said second electrode is disposed opposite to said first electrode such that said substrate is disposed between said second electrode and said first electrode.

9. The plasma processing system of claim 6, wherein each said period defines a pulse.

10. The plasma processing system of claim 6, wherein each of said negatively ramped portions is configured to attract positive ions in said plasma processing system.

* * * * *